United States Patent [19]
Ueki

[11] Patent Number: 5,416,482
[45] Date of Patent: May 16, 1995

[54] RESISTANCE LADDER

[75] Inventor: Yuji Ueki, Itami, Japan

[73] Assignee: Mitsubishi Denki Kabushiki Kaisha, Tokyo, Japan

[21] Appl. No.: 31,405

[22] Filed: Mar. 15, 1993

[30] Foreign Application Priority Data

Mar. 17, 1992 [JP] Japan .................................. 4-060250

[51] Int. Cl.6 .............................................. H03M 1/00
[52] U.S. Cl. ..................................... 341/136; 341/145
[58] Field of Search ......................... 341/136, 144, 145

[56] References Cited

U.S. PATENT DOCUMENTS

| | | | |
|---|---|---|---|
| 3,812,478 | 5/1974 | Tomisawa et al. | 307/238 |
| 4,281,319 | 7/1981 | Roberts, Jr. | 341/136 |
| 4,398,207 | 8/1983 | Hoff, Jr. et al. | 357/51 |
| 4,447,747 | 5/1984 | LaPotin | 307/529 |
| 4,541,103 | 9/1985 | Gregorian et al. | 375/32 |
| 4,594,733 | 6/1986 | Kanzaki et al. | 382/50 |
| 4,667,178 | 5/1987 | Ryu | 341/136 |
| 4,742,330 | 5/1988 | Doernberg et al. | 341/159 |

FOREIGN PATENT DOCUMENTS

| | | |
|---|---|---|
| 3604158C2 | 2/1990 | Germany . |
| 59-134867 | 8/1984 | Japan . |
| 63-156410 | 6/1988 | Japan . |
| 2-168708 | 6/1990 | Japan . |

*Primary Examiner*—Marc S. Hoff
*Attorney, Agent, or Firm*—Lowe, Price, LeBlanc & Becker

[57] ABSTRACT

A resistance ladder of a small size and a decoding method thereof, wherein in-series circuits of MOS transistors using a contact hole in common are connected in parallel between the adjacent two connection nodes of a resistance element, and an output line is wired to cross the resistance element, thereby reducing the layout pattern area of the resistance ladder.

10 Claims, 6 Drawing Sheets

RESISTANCE LADDER

BACKGROUND OF THE INVENTION

1. Field of the Invention

This invention relates to a resistance ladder formed on a semiconductor integrated circuit.

2. Description of the Related Art

In the case, for example, where an analog/digital (A/D) converter or a digital/analog (D/A) converter is formed on a one-chip semiconductor integrated circuit, a resistance ladder is used in some of the analog/digital converting section or digital/analog converting section of the converter. The layout of the above conventional resistance ladder is such structure as shown in FIG. 1.

Resistance elements 3–18 are connected in series between a ground terminal 1 and a source terminal 2. Connection parts between the ground terminal 1 and resistance element 3, the resistance elements 10 and 9, the resistance elements 10 and 11, and the resistance elements 18 and 17 are respectively connected to an output line 111 via corresponding switching MOS transistors 95, 96, 97 and 98. Connection parts between the resistance elements 3 and 4, 9 and 8, 11 and 12, and 17 and 16 are respectively connected to an output line 112 via corresponding switching MOS transistors 99, 100, 101 and 102. Connection parts between the resistance elements 4 and 5, 8 and 7, 12 and 13, and 16 and 15 are respectively connected to an output line 113 via corresponding switching MOS transistors 103, 104, 105 and 106. Moreover, connection parts between the resistance elements 5 and 6, 7 and 6, 13 and 14, and 14 and 15 are connected to an output line 114 via corresponding switching MOS transistors 107, 108, 109 and 110. These output lines 111–114 are connected to a mutiplexer 115 which selects one of the output lines. The output from the selected line by the multiplexer 115 is outputted to an output terminal 116 in accordance with a value of a multiplex signal 117 inputted to a multiplexer 115.

When the switching MOS transistor 99 is turned ON in the resistance ladder while the switching MOS transistors 95–110 other than the switching MOS transistor 99 are kept OFF, the voltage impressed to the source terminal 2 is converted to a voltage equal to the sum of the voltage drops at the resistance elements 4–18 and inputted to the multiplexer 115. When the multiplexer 115 selects the output line 112 in compliance with the multiplex signal 117, the voltage of the output line 112 is outputted to the output terminal 116.

The resistance ladder of the above-described structure is disclosed in Japanese Patent Application Laid-Open Nos. 63-156410 (1988) and 2-168708 (1990).

In the arrangement of FIG. 1, it is necessary to provide output lines of the number equal to the number of the resistance elements constituting one row of the resistance ladder. Therefore, the pattern area of the resistance adder disadvantageously increases in order to arrange the output lines within the resistance ladder layout pattern. Moreover, the number of resistance elements forming one row of the resistance ladder is generally larger than that of the rows of the resistance ladder, thus necessitating many output lines. Therefore, in the case where one line should be selected from the above many output lines, the pattern area of the multiplexer layout enlarges in proportional to the number of the output lines, which causes a rise in cost.

In addition, when a node voltage is to be selected by a MOS transistor as in the prior art resistance ladders disclosed in Japanese Patent Application Laid-Open Nos. 63-156410 and 2-168708, it accompanies a demerit that the pattern area increases.

SUMMARY OF THE INVENTION

This invention has been devised to solve the aforementioned drawbacks and has for its object to provide a resistance ladder to reduce the layout pattern area and cost by connecting adjacent resistances in common to one output line.

The above and further objects and features of the invention will more fully be apparent from the following detailed description with accompanying drawings.

DESCRIPTION OF THE PREFERRED EMBODIMENTS

This invention will be discussed hereinafter taken in conjunction with preferred embodiments thereof referring to the accompanying drawings.

Figure 1:
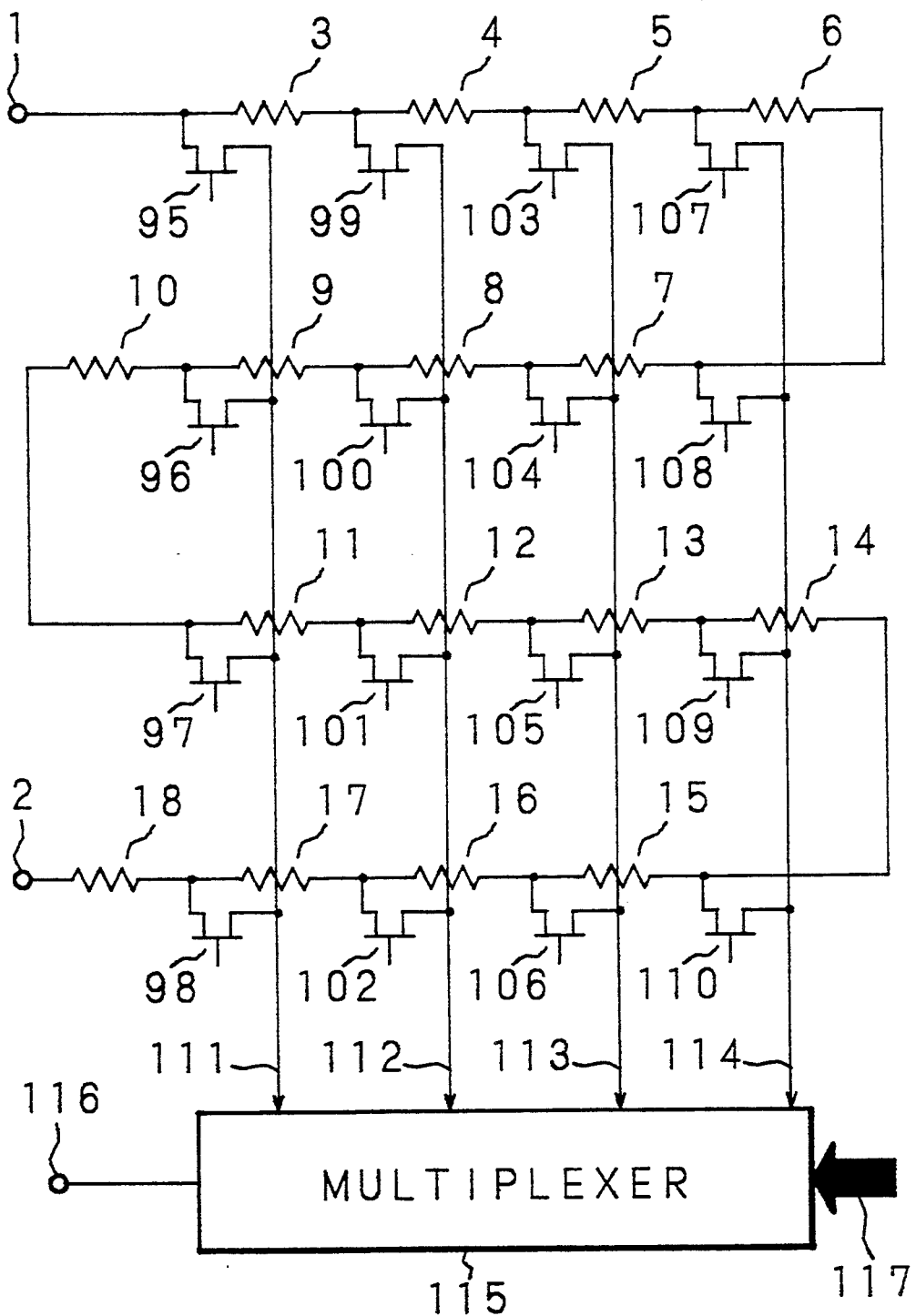
FIG. 1 is a circuit diagram indicating the structure of a conventional resistance ladder.
Figure 2:
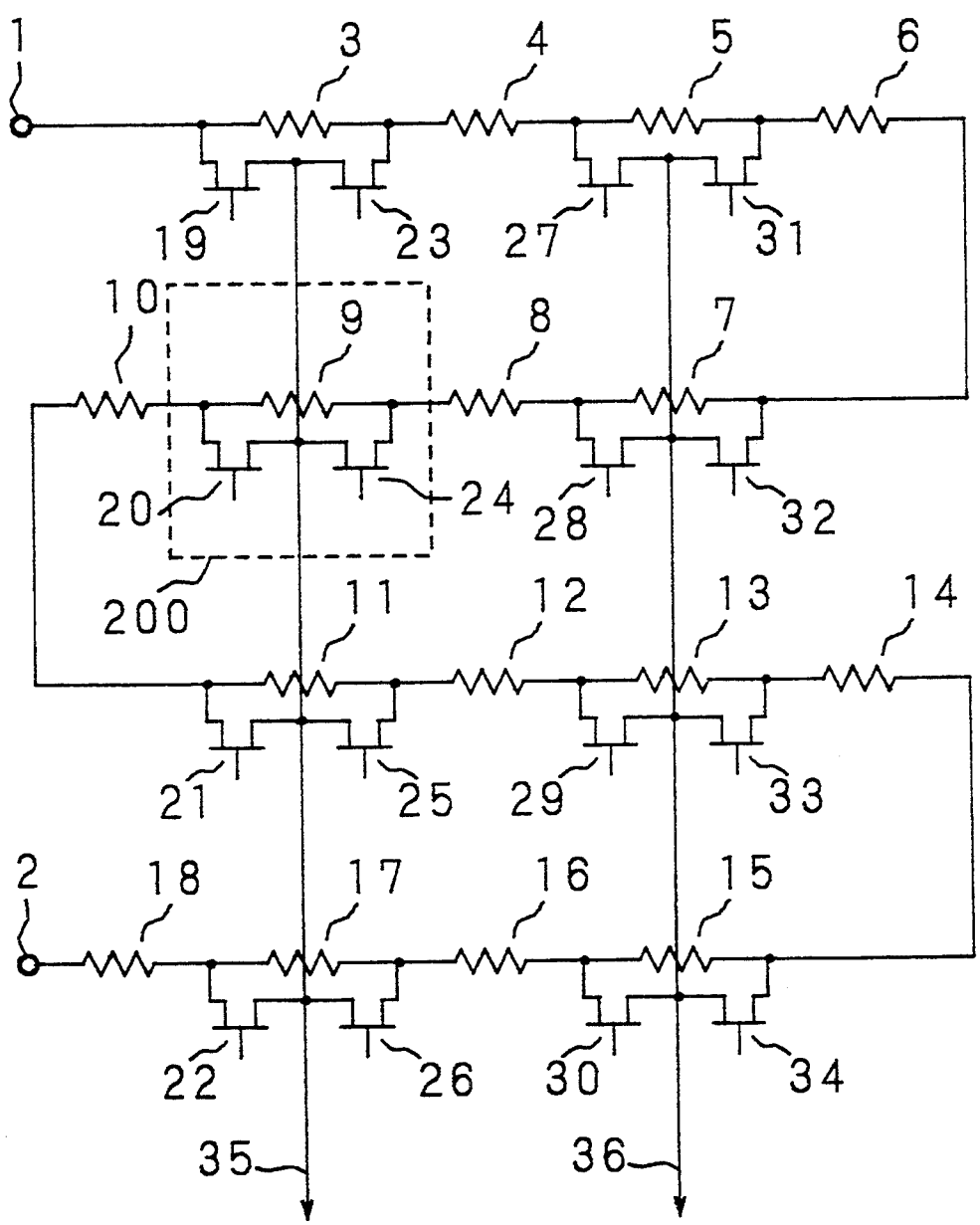
FIG. 2 is a circuit diagram indicating the structure of a resistance ladder of this invention.

FIG. 2 is a circuit diagram indicative of the structure of a resistance ladder according to this invention. A series-connected circuit of a plurality of resistance elements 3–18 is connected between the ground terminal 1 and a source terminal 2. A series-connected circuit of switching MOS transistors (referred to as MOS transistors) 19 and 23 (20 and 24, 21 and 25, 22 and 26) is inserted between the adjacent resistance nodes of each resistance element 3 (9, 11, 17). Respective connection parts of the MOS transistors 19 and 23, 20 and 24, 21 and 25, and 22 and 26 are connected in common to an output line 35 which is arranged to cross over the resistance elements 9, 11 and 17. A series-connected circuit of MOS transistors 27 and 31 (28 and 32, 29 and 33, 30 and 34) is connected to both ends of the resistance element 5 (7, 13, 15). Connecting parts of the MOS transistors 27 and 31, 28 and 32, 29 and 33, and 30 and 34 are connected in common to an output line 36 arranged to cross over the resistance elements 7, 13 and 15.

In the resistance ladder constructed as above, for instance, when only the MOS transistor 23 is turned ON, the voltage applied to a source terminal 2 is converted to a voltage equal to the sum of the voltage drops of the resistance elements 4–18, and outputted to the output line 35. When the MOS transistor 32 is only turned ON, similar to the above, the voltage converted to a voltage equal to the sum of the voltage drop of the resistance elements 7–18 is outputted to the output line 36.

Figure 3:
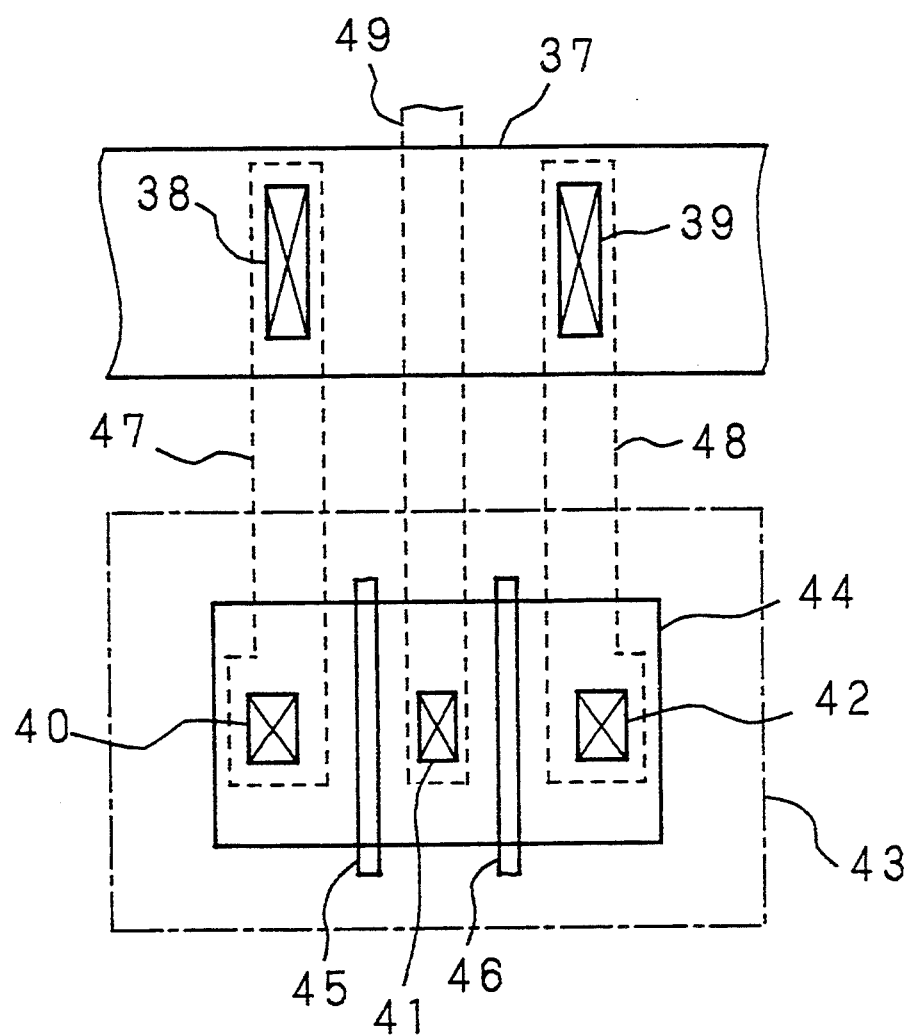
FIG. 3 is an enlarged layout pattern of a basic circuit in FIG. 2.

FIG. 3 is an enlarged diagram of a layout pattern of a basic circuit 200 surrounded by a broken line in FIG. 2. A resistance pattern 37 is formed in parallel to a well 43. One resistance element is formed between contact holes 38 and 39 in the resistance pattern 37. In the well 43, a rectangular diffusion area 44 is formed, where two MOS transistors are formed between contact holes 40 and 41, and 41 and 42 by switching gate layers 45 and 46, respectively.

Al layers 47, 48 extending from the resistance pattern 37 to the well 43 respectively connect the contact holes 38, 39 in the resistance pattern 37 to the contact holes 40, 42 in the diffusion area 44. Therefore, the outputs from the contact holes 38, 39 of the resistance pattern 37 are inputted to the MOS transistors formed by the switching gates 45, 46. At this time, output parts of the MOS transistors use the contact hole 41 in common. The contact hole 41 formed between the Al layers 47 and 48 is connected to an Al layer 49 parallel to the Al layers 47, 48. The Al layer 49 consequently crosses over the resistance element between the contact holes 38 and 39. The above well 43 may be a substrate well.

In the layout pattern of FIG. 3, the MOS transistors connected to the adjacent two resistance nodes use the output part in common, thereby reducing the number of output lines from the conventionally required two to a single one. As a result, the interval of the contact holes to form the resistance element in the resistance pattern 37 can be shortened. In the instant embodiment, the resistance ladder consists of four resistance elements in each of four rows. But, in general, the number of the resistance elements constituting one row of the resistance ladder is greater than that of the rows of the resistance ladder. Therefore, the pattern area of the resistance ladder can be remarkably reduced if the resistance ladder is constructed in the layout pattern depicted before.

Figure 4:
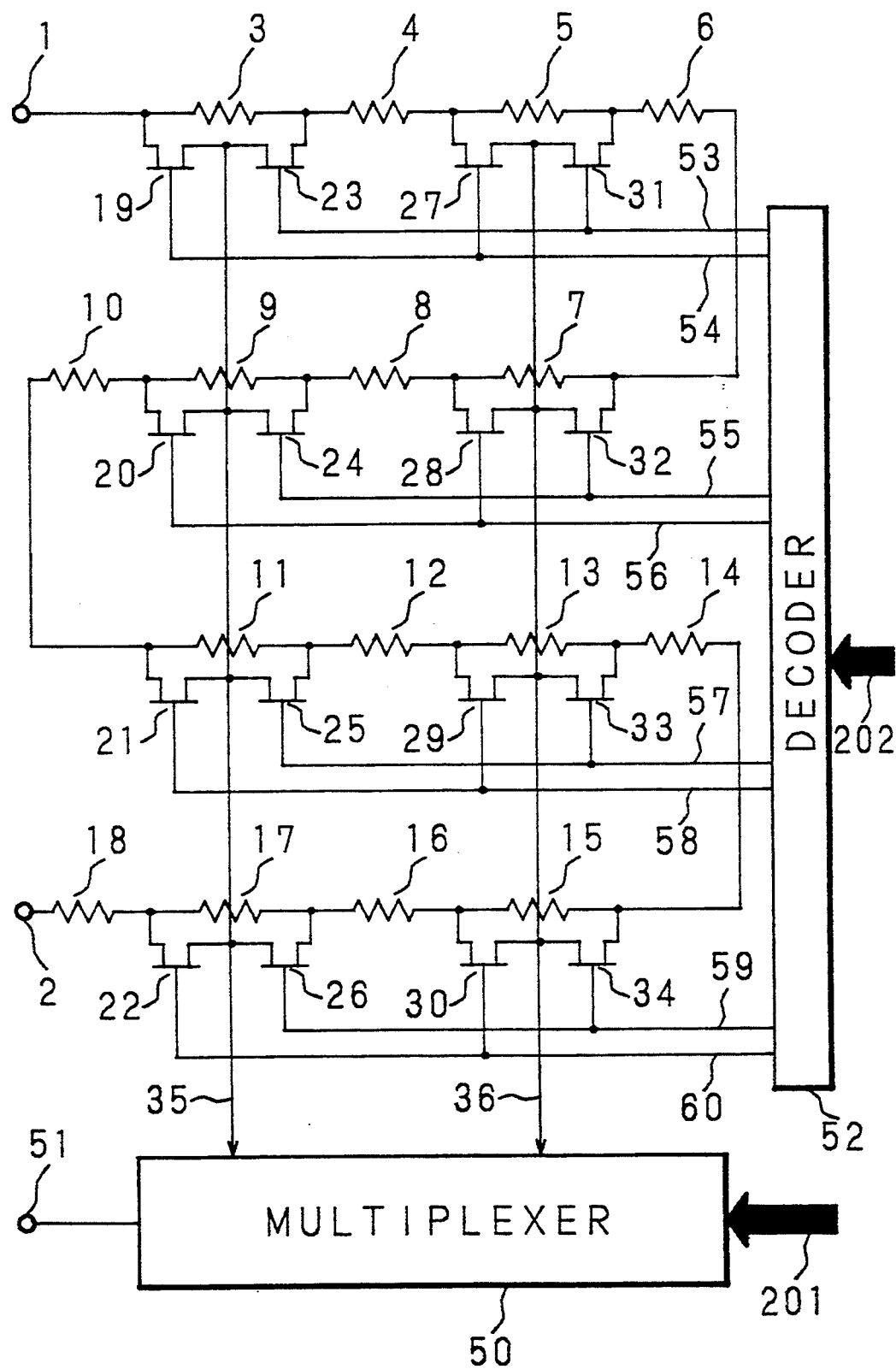
FIG. 4 is a circuit diagram for embodying a decoding method of a resistance ladder according to this invention.

FIG. 4 is a circuit diagram representing a decoding method to take out a node voltage from one resistance node of the resistance ladder. A series circuit of resistance elements 3-18 is connected between the around terminal 1 and the source terminal 2. Between the adjacent resistance nodes of a resistance element 3 (9, 11, 17) are connected a series circuit of MOS transistors 19 and 23 (20 and 24, 21 and 25, 22 and 26). Connection parts of the MOS transistors 19 and 23, 20 and 24, 21 and 25, and 22 and 26 respectively have common contact holes and connected in common to the output line 35 disposed to cross over the resistance elements 9, 11 and 17.

On the other hand, a series circuit of MOS transistors 27 and 31 (28 and 32, 29 and 33, 30 and 34) is connected between the adjacent resistance nodes of the resistance element 5 (7, 13, 15). The connection parts between the MOS transistors 27 and 31, 28 and 32, 29 and 33 and, 30 and 34 are connected to the output line 36 arranged to cross over the resistance elements 7, 13, 15. The output lines 35 and 36 are connected to a multiplexer 50 which selects one of the inputs from the output lines 35 and 36. The selected output from the output line by the multiplexer 50 is outputted to an output terminal 51 in accordance with a value of a multiplex signal 201 inputted to the multiplexer 50. Gates of the MOS transistors 23(19) and 31(27) are connected to a decoder 52 via a decode signal line 53(54), while gates of the MOS transistors 24(20) and 32(28) are connected to the decoder 52 via a decode signal line 55(56). Gates of the MOS transistors 25(21) and 33(29) are connected as well to the decoder 52 via a decode signal line 57(58), while gates of the MOS transistors 26(22) and 34(30) are also connected to the decoder 52 via a decode signal line 59(60).

A signal 202 to determine the outputs from the decode signal lines 53, 54 . . . 60 is fed to the decoder 52.

The operation of decoding will be described hereinafter. When an ON signal is fed to one of the decode signal line 53-60 by the signal 202 to the decoder 52, one of the paired MOS transistors connected to,the output lines 35 and 36 are turned ON. The voltages of the resistance nodes connected to the ON MOS transistors are outputted to the output, lines 35 and 36, then inputted to the multiplexer 50. As the multiplexer 50 selects one of the output lines 35 and 36 in accordance with the multiplexer signal 201, the voltage of the selected output line is outputted to the output terminal 51. Consequently, this voltage selects the voltage of one of the nodes of the resistance ladder connected to the MOS transistors 19-34.

In the manner as described before, since the MOS transistors connected to the adjacent two resistance nodes use the output part in common, tile number of the output lines which is necessary to be two in the conventional decoding method is reduced to one, thereby reducing the number of the output lines to be selected by the multiplexer. Accordingly, the circuit scale of the multiplexer 50 may be smaller than the conventional decoding method.

Figure 5:
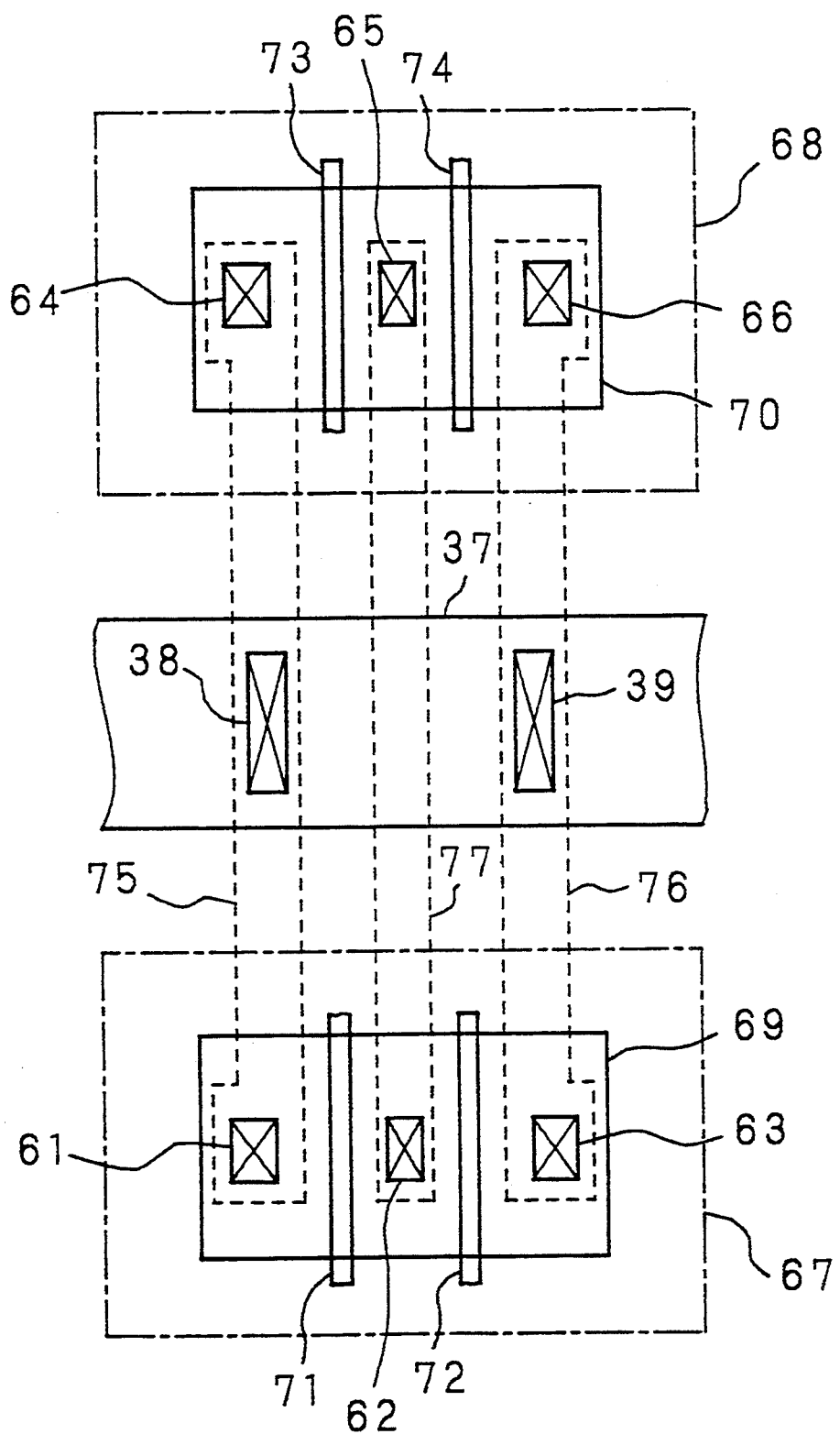
FIG. 5 is an enlarged diagram of another layout pattern of the basic circuit in FIG. 2.

FIG. 5 is an enlarged diagram of another layout pattern of the basic circuit 200 of FIG. 2. An N-type well 67 is formed on one side of a long resistance pattern 37. The N-type well 67 has a P-type diffusion area 69 in which MOS transistors are formed between contact holes 61 and 62, and 62 and 63 by switching gate layers 71 and 72 formed in parallel to each other. A P-type well 68 is formed on the other side of the resistance pattern 37, having an N-type diffusion area 70. In the N-type diffusion area 70, there are formed MOS transistors between contact holes 64 and 65, and 65 and 66 by switching gate layers 73 and 74, respectively. A contact hole 38 is connected to the contact holes 61 and 64 by an Al layer 75 formed orthogonal to the resistance pattern 37. A contact hole 39 is connected to the contact holes 63 and 66 by an Al layer 76 parallel to the Al layer 75.

More specifically, the outputs from the contact holes 38 and 39 in the resistance pattern 37 are inputted to the P-type MOS transistors formed by the switching gate layers 71 and 72 and their output parts use the contact hole 62 in common. Similarly, the outputs from the contact holes 38 and 39 are inputted to the N-type MOS transistors formed by the switching gate layers 73 and 74 and their output parts use the contact hole 65 in common. As described above, by providing the N-type diffusion area 68 and the P-type diffusion area 67, MOS transistors of different types are formed on both sides of the resistance pattern 37. The contact holes 62 and 65 are formed between the Al layers 75 and 76, and connected with each other via an Al layer 77 formed in parallel to the Al layers 75, 76. The Al layer 77 crosses over the resistance element between the contact holes 32 and 39. Accordingly, different types of MOS transistors are formed on both sides of the resistance pattern 37.

Though in the instant embodiment, the N-type well and the P-type well are employed, the substrate well may be employed.

Figure 6:
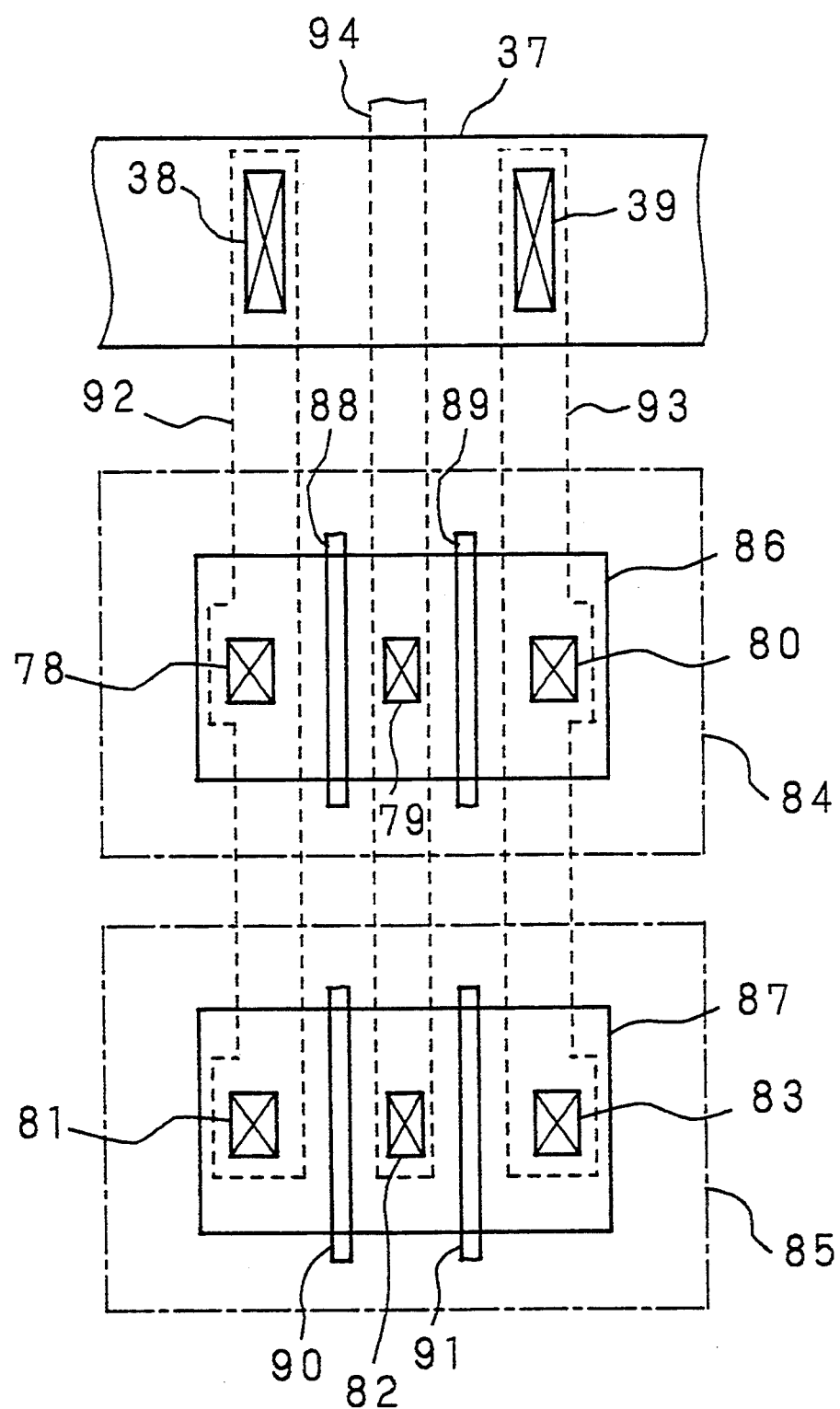
FIG. 6 is an enlarged diagram of further layout pattern of the basic circuit in FIG. 2.

FIG. 6 indicates an enlarged diagram of a further layout pattern of the basic circuit 200 of FIG. 2. An N-type well 84 and a P-type well 85 are sequentially formed on one side of a long resistance pattern 37 in this order. A resistance element is formed between contact holes 38 and 39 of the resistance pattern 37. A P-type diffusion area 86 is formed in the N-type well 84.

Switching gate layers 88, 89 formed at right angles to the resistance pattern 37 in the P-type diffusion area 86 are arranged to form MOS transistors between contact holes 78 and 79, and 79 and 80.

The P-type well 85 has an N-type diffusion area 87, having MOS transistors formed between contact holes 81 and 82, and 82 and 83 by switching gate layers 90 and 91 respectively arranged in lines with the switching gate layers 88 and 89. The contact hole 38 is connected with the contact holes 78 and 81 by an Al layer 92 arranged orthogonal to the resistance pattern 37. Moreover, the contact hole 39 is connected with the contact holes 80 and 83 by an Al layer 93 in parallel to the Al layer 92 with the switching gate layers 90, 91 intervening.

That is, the outputs from the contact holes 38, 39 in the resistance pattern 37 are inputted to the P-type MOS transistors formed by the switching gate layers 88 and 89 whose output parts use the contact hole 79 in common. The outputs from the contact holes 38, 39 are also inputted to the N-type MOS transistors formed by the switching gate layers 90 and 91 whose output marts use the contact hole 82 in common. Accordingly, the P-type MOS transistors and the N-type MOS transistors are arranged on one side of the resistance pattern 37 in this order.

The contact holes 79 and 82 are connected with each other via an Al layer 94 arranged between the Al layers 92 and 93. The Al layer 94 crosses over the resistance element portion between the contact holes 38 and 39.

Although the P-type MOS transistor and the N-type MOS transistors are arranged in this order from the resistance pattern 37 in FIG. 6, the type of the wells and the arranging order of the transistors may be changed vice versa, and further one of the wells may be the substrate well.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A resistance ladder provided with a plurality of resistances connected in series between a ground and a power source like a ladder, where a voltage at one connection node of the resistance is selected comprising:

MOS transistor means connected in series by two with a contact hole in common, and each two is connected to each adjacent pair of connection nodes of said plurality of resistances;

an output line connected to said contact hole for outputting a voltage from either of said pair of connection nodes, and wired to cross over a resistance between said pair of connection nodes formed in a resistance pattern area positioned in parallel with a diffusion area comprising said MOS transistor means and said contact hole coupled to other contact holes of said ladder through a conductive layer crossing said resistance pattern area between said pair of connection nodes.

2. A resistance ladder as set forth in claim 1, further comprising:

a decoder for turning on either ones of each of said two MOS transistor means connected to one row of resistances among rows of said series-connected resistances like a ladder; and a multiplexer for selecting one outputted voltage from one output line among plural outputted voltages.

3. A resistance ladder as set forth in claim 1, wherein each of said two MOS transistor means comprises a pair of N-type MOS transistors arranged on one side of a row of the series-connected resistances and a pair of P-type MOS transistors arranged on the other side.

4. A resistance ladder as set forth in claim 1, wherein each of said two MOS transistor means comprises a pair of N-type MOS transistors and a pair of P-type MOS transistors both pairs arranged on the same side of a row of series-connected resistances in a direction parallel to the output line.

5. A resistance ladder having a plurality of resistor means connected in series between first and second power supply terminals and a plurality of transistor means coupled in pairs in parallel to said resistor means to provide an output signal through an output line coupled to common nodes connecting the transistor means in each of the pairs, said resistance ladder comprising:

a diffusion area formed on a main surface of a substrate for defining each said pair of transistor means with said common node, a resistance area formed on the main surface for defining said resistor means, first and second parallel conductive buses for coupling said diffusion area with said resistance area to connect in parallel each said pair of transistor means to said resistor means, and a third conductive bus crossing said resistance area between and in parallel to said first and second conductive buses for coupling said common node on said diffusion area to said output line.

6. The resistance ladder of claim 5, wherein each said pair of transistor means comprises a pair of N-type MOS transistors and a pair of P-type MOS transistors arranged in said diffusion area on opposite sides of said resistance area.

7. The resistance ladder of claim 5, wherein each said pair of transistor means comprises a pair of N-type MOS transistors and a pair of P-type MOS transistors arranged in said diffusion area on the same side with respect to said resistance area.

8. In a resistance ladder having a plurality of resistor means connected in series between first and second power supply terminals and arranged in rows and columns, a plurality of pairs of MOS transistor means, each pair of MOS transistor means being coupled in parallel to a corresponding resistor means, a method of selecting an output signal comprising:

through a decoding line corresponding to a row of the ladder, supplying the MOS transistor means in the pairs coupled to the resistor means in a row of resistor means with a decoding signal to turn on one of the MOS transistor means in the pairs, and through an output line connecting common nodes of the transistor means in each of the pairs coupled to the resistor means in a column of the resistor means, providing the output signal.

9. The method of claim 8, wherein said decoding signal is supplied to pairs of P-type MOS transistors and pairs of N-type transistors arranged on opposite sides of an area of the resistor means coupled to said P-type and N-type MOS transistors.

10. The method of claim 8, wherein said decoding signal is supplied to pairs of P-type MOS transistors and pairs of N-type transistors arranged on the same side with respect to an area of the resistor means coupled to said P-type and N-type MOS transistors.

* * * * *